(12) United States Patent
Yang

(10) Patent No.: US 7,268,081 B2
(45) Date of Patent: Sep. 11, 2007

(54) WAFER-LEVEL TRANSFER OF MEMBRANES WITH GAS-PHASE ETCHING AND WET ETCHING METHODS

(75) Inventor: Eui-Hyeok Yang, Stevenson Ranch, CA (US)

(73) Assignee: California Institute of Technology, Pasadena, CA (US)

( * ) Notice: Subject to any disclaimer, the term of this patent is extended or adjusted under 35 U.S.C. 154(b) by 418 days.

(21) Appl. No.: 10/678,359

(22) Filed: Oct. 2, 2003

(65) Prior Publication Data
US 2004/0063322 A1 Apr. 1, 2004

Related U.S. Application Data

(63) Continuation-in-part of application No. 10/005,765, filed on Nov. 2, 2001, now Pat. No. 6,777,312.

(60) Provisional application No. 60/477,910, filed on Jun. 12, 2003, provisional application No. 60/307,677, filed on Jul. 24, 2001, provisional application No. 60/245,650, filed on Nov. 2, 2000.

(51) Int. Cl.
*H01L 21/302* (2006.01)

(52) U.S. Cl. .................. 438/694; 438/455; 438/459; 438/464; 438/928; 438/968

(58) Field of Classification Search ............. 438/455, 438/458, 459, 464, 694, 714, 928, 967, 968
See application file for complete search history.

(56) References Cited

U.S. PATENT DOCUMENTS

| | | | |
|---|---|---|---|
| 4,383,886 A | 5/1983 | Nakamura et al. | |
| 4,700,467 A | 10/1987 | Donzelli | |
| 4,784,970 A | 11/1988 | Solomon | |
| 4,794,092 A | 12/1988 | Solomon | |
| 5,185,292 A | 2/1993 | VanVonno et al. | |
| 5,827,755 A | 10/1998 | Yonehara et al. | |
| 6,004,867 A | 12/1999 | Kim et al. | |
| 6,013,534 A | 1/2000 | Mountain | |
| 6,322,903 B1 | 11/2001 | Siniaguine et al. | |
| 6,455,398 B1 | 9/2002 | Fonstad et al. | |
| 6,521,477 B1 | 2/2003 | Gooch et al. | |
| 2002/0146200 A1* | 10/2002 | Kudrle et al. | ............ 385/18 |

OTHER PUBLICATIONS

K.F. Harsh, W. Zhang, V.M. Bright and Y.C. Lee, "Flip-Chip Assembly for Si-Based RF MEMS", Proc. MEMS '99, Orlando, Florida, pp. 273-278, Jan. 1999.

(Continued)

*Primary Examiner*—George A. Goudreau
(74) *Attorney, Agent, or Firm*—Fish & Richardson P.C.

(57) ABSTRACT

Techniques for transferring a membrane from one wafer to another wafer to form integrated semiconductor devices. In one implementation, a carrier wafer is fabricated to include a membrane on one side of the carrier wafer. The membrane on the carrier wafer is then bond to a surface of a different, device wafer by a plurality of joints. Next, the carrier wafer is etched away by a dry etching chemical to expose the membrane and to leave said membrane on the device wafer. Transfer of membranes with a wet etching process is also described.

16 Claims, 16 Drawing Sheets

OTHER PUBLICATIONS

T. Akiyama, U. Stzufer and N de Rooij, "Wafer-and Piece-Wise Si Tip Transfer Technologies for Applications in Scanning Probe Microscopy", IEEE Journal of Microelectromechanical Systems, pp. 65-70, 1999.

A. Singh, D.A. Horsley, M. Cohn, A. Pisano and R.T. Howe, "Batch Transfer of Microstructures using Flip-Chip Solder Bonding", IEEE Journal of Microelectromechanical Systems, pp. 27-33 1999.

H. Nguyen, P. Patterson, H. Toshiyoshi and M.C. Wu, "A Substrate-Independent Wafer Transfer Technique for Surface-Micromachined Devices", Proc MEMS Conference, 2000.

TE Bell and KD Wise, "A dissolved wafer process using a porous silicon . . . " Proc MEMS 98, Heidleberg Germany, Jan. 25-29, 1998, pp. 251-256.

CG Keller and RT Howe, "Hexile tweezers for teleoperated microassembly", Proc MEMS 97, Nagoya, Japan, 1997 pp. 72-77.

Y.T. Chen, "Localized Bonding with PSG or Indium Solder as Intermediate Layer", 1999 IEEE.

Michael M. Maharbiz, "Batch Micropackaging by Compression-Bonded Wafer-Wafer Transfer", 1999 IEEE.

* cited by examiner

Teflon fixture 300 — O-ring

WAFER-LEVEL TRANSFER OF MEMBRANES WITH GAS-PHASE ETCHING AND WET ETCHING METHODS

This application is a continuation-in-part application of U.S. application Ser. No. 10/005,765 filed Nov. 2, 2001 now U.S. Pat. No. 6,777,312. The U.S. application Ser. No. 10/005,765 claims priority from and the benefits of U.S. Provisional Application Nos. 60/245,650 filed Nov. 2, 2000 and 60/307,677 filed Jul. 24, 2001.

This application further claims the benefit of U.S. Provisional Application No. 60/477,910 entitled "Stress-Free Membrane Transfer Technique Using $XeF_2$" and filed Jun. 12, 2003.

ORIGIN OF THE INVENTION

The systems and techniques described herein were made in the performance of work under a NASA contract, and are subject to the provisions of Public Law 96-517 (35 USC 202) in which the Contractor has elected to retain title.

BACKGROUND

This application relates to semiconductor processing, and more specifically, to transfer of a layered structure such as a membrane from one wafer to another wafer.

A semiconductor wafer can be processed to fabricate various structures in an integrated package. Such structures may be formed from fabricating and patterning various layers on the wafer using various microfabrication processes. Each layer may be a semiconductor material, a conductor material such as a doped semiconductor material and a metal, or an insulator such as a glass, an oxide or a nitride. In addition, various micromachining processes may be used to fabricate micro structures on the wafer. The microfabrication and micromachining processes can be used to fabricate a variety of integrated semiconductor structures to form semiconductor components, devices and systems, including integrated circuits, opto-electronic devices, micro optical devices, and microelectro-mechanical systems (MEMS).

A layered structure such as a membrane is a common structure in fabricating many semiconductor devices and systems. For example, a silicon or polysilicon membrane parallel to the wafer may be used as an optical mirror. In adaptive optics, such a membrane may be engaged to microactuators to deform in a controlled manner to correct distortions in the wavefront of received optical images. This layered structure may be "natively" grown by directly forming the layer on the wafer on which the final device is fabricated. Alternatively, it may be advantageous or necessary to fabricate such a layer on a separate substrate and then transfer the layer onto the wafer on which the final device is fabricated.

SUMMARY

This application includes techniques for transferring a membrane from one wafer to another wafer to form integrated semiconductor devices. According to one embodiment, a carrier wafer is fabricated to include a membrane on one side of the carrier wafer. The membrane on the carrier wafer is then bond to a surface of a different, device wafer by a plurality of joints. The joints and the device wafer are then isolated from exposure to etching chemicals. Next, the carrier wafer is selectively etched away to expose the membrane and to leave said membrane on the device wafer.

The joints between the membrane and the device wafer may be direct semiconductor-to-semiconductor joints or may use metal joints such as indium. The etching of the carrier wafer may be implemented by using either a wet-etching process or a dry gas-phase etching process.

A dry etching process with a gaseous etchant may be used to transfer a membrane. In one implementation, a carrier wafer is prepared to have a support wafer made of a semiconductor material, a carrier passivation layer formed on a surface of the support wafer, and a membrane formed on the carrier passivation layer. The carrier passivation layer is inert to a gaseous etchant that etches the semiconductor material. A surface of a device wafer made from the semiconductor material is patterned to form a plurality of posts each having a top flat surface. A passivation layer is then formed on exterior surfaces of the device wafer without covering each top flat surface of each post. Next, the carrier wafer is placed on the device wafer to have the membrane directly contact top flat surfaces of the posts. A direct semiconductor-to-semiconductor bonding between the membrane and the top flat surfaces to bond the carrier wafer to the device wafer. Next, the bonded carrier wafer and the device wafer are exposed to the gaseous etchant to etch away the support wafer in the carrier wafer and to expose the carrier passivation layer. The carrier passivation layer is subsequently removed to transfer the membrane to the device wafer.

In another implementation of the dry etching transfer, a carrier wafer is prepared to have a support wafer made of a semiconductor material, a carrier passivation layer formed on a surface of the support wafer, a membrane formed on the carrier passivation layer, and a plurality of metal posts on the membrane. The carrier passivation layer is inert to a gaseous etchant that etches the semiconductor material. A surface of a device wafer made from the semiconductor material is patterned to form a plurality of metal posts respectively corresponding to the metal posts on the membrane. The carrier wafer is then placed on the device wafer to have metal posts on the membrane directly contact metal posts on the device wafer, respectively. Next, direct metal-to-metal bonding is formed between contacting metal posts to bond the carrier wafer to the device wafer. A passivation layer is formed on exterior surfaces of the device wafer while leaving the support wafer exposed. The bonded carrier wafer and the device wafer are exposed to the gaseous etchant to etch away the support wafer in the carrier wafer and to expose the carrier passivation layer. To complete the transfer, the carrier passivation layer is removed.

As yet another implementation of the dry etching transfer, a carrier wafer is prepared to have a support wafer made of silicon, a carrier passivation layer formed on a surface of the support wafer, a membrane formed on the carrier passivation layer, and a plurality of posts on the membrane. The carrier passivation layer is inert to a gaseous etchant that etches silicon. The carrier wafer is placed on a device wafer to bond the posts to the device wafer. A passivation layer is then formed on exterior surfaces of the device wafer while leaving the support wafer exposed. The bonded carrier wafer and the device wafer are exposed to the gaseous etchant to etch away the support wafer in the carrier wafer and to expose the carrier passivation layer. Next, the carrier passivation layer is removed to transfer the membrane to the device wafer.

These and other implementations are described in greater detail with reference to the drawings, the detailed description, and the claims.

DETAILED DESCRIPTION

The present techniques for transfer of membranes are used to transfer a layered structure such as a membrane fabricated in a carrier wafer to another "device wafer" on which a device or system is fabricated using the transferred membrane. In general, the present techniques include three basic fabrication stages: wafer preparation, hermetic wafer bonding, and selective removal of the carrier wafer. In the wafer preparation stage, the carrier and the device wafers are prepared to form surface structures for the final device such as patterns on the membrane in the carrier wafer, patterns and electrodes on the device. In addition, bonding structures or joints may also be fabricated for bonding the carrier and device wafers together. Next in the wafer bonding stage, a direct bonding process is used to form hermetic bonding between two wafers. The hermetic nature of the bonding is desirable because the subsequent fabrication relies on the hermetic seal at the bonding locations to select certain portions of the carrier wafer to etch for the transfer. Various fabrication steps may be implemented in the above three stages to transfer different membranes. The selective removal of the carrier wafer to release the membrane includes isolation of the device wafer and the bonding structure between the membrane and the device wafer from any etching chemicals. This isolation protects the bonding between the membrane and the device wafer and allows a variety bonding materials to be used, such as indium bumps and epoxy materials.

Figure 1A:
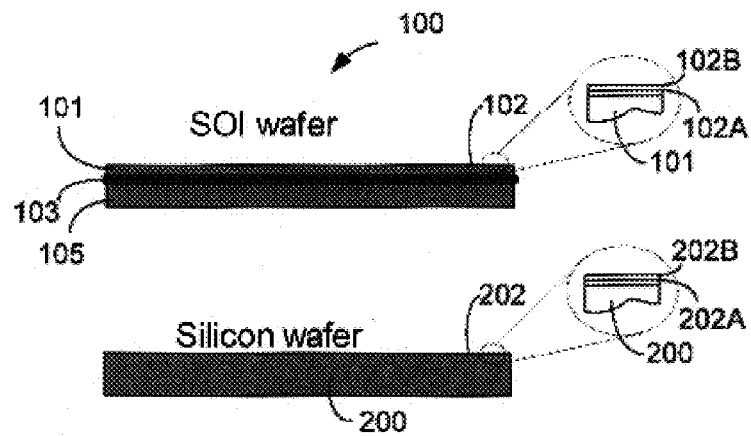
FIGS. 1A and 1B illustrate preparation of a carrier wafer and a device wafer for transferring a membrane in the carrier wafer to the device wafer according to one embodiment.
Figure 1B:
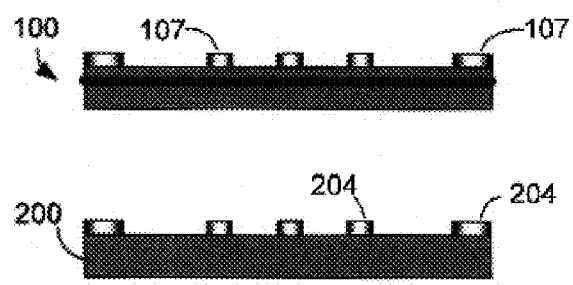
Figure 2:
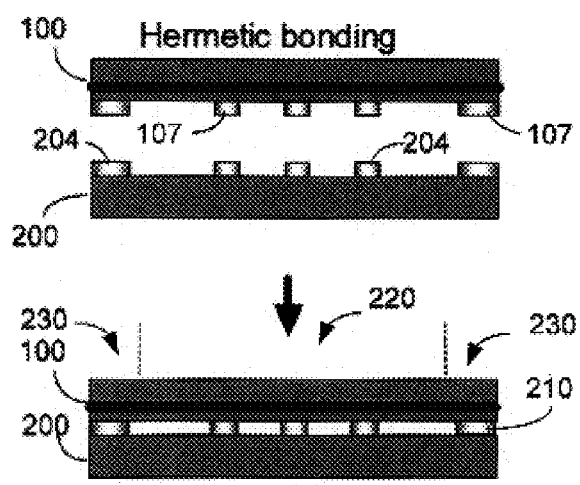
FIGS. 2 illustrates bonding of the carrier wafer to the device wafer according to one embodiment.

FIGS. 1A through 4B illustrate transfer of a single-crystal semiconductor membrane 101 from a carrier wafer 100 to a device wafer 200 according to one embodiment. More specifically, FIGS. 1A and 1B illustrate the wafer preparation; FIG. 2 illustrates the hermetic bonding; and FIGS. 3A through 4B illustrate the selective etching of the bonded carrier wafer.

Referring to FIG. 1A, the carrier wafer 100 is a silicon-on-insulator (SOI) wafer which includes the silicon membrane 101 (e.g. on the order of one micron to tens of microns), a thick single-crystal silicon layer 105 (e.g., a few hundred microns), and a thin insulator layer 103 of less than one micron formed of an insulating material such as a silicon oxide and a silicon nitride and sandwiched between the silicon layers 101 and 105. The insulator layer 103 is assumed to be silicon dioxide as an example in the following description. A semiconductor other than silicon may be used for the wafers 100 and 200, including germanium, a III-V compound like GaAs and GaP, and a II-VI compound. The use of GaAs and other semiconductors for semiconductor opto-electronic devices as the device wafer 200 allows for integration opto-electronic components in the final device.

A thin oxide layer 102A, e.g., silicon dioxide of about 0.5 micron, is thermally grown over the surface of the membrane 101 on the carrier wafer 100. At this stage, the membrane 101 may be etched to form various surface patterns. Next, a photoresist layer is formed and patterned to define locations of indium bumps 107 to be formed on the membrane 101 for hermetic bonding to the device wafer 200. A metallization layer 102B of Cr/Pt/Au is deposited subsequently over the patterned photoresist layer for a subsequent lift-off process. The silicon device wafer 200 may be similarly prepared by forming an oxide layer 202A, and the patterned photoresist layer for locations of bonding indium bumps 204, and a metalization layer 202B of Cr/Pt/Au for the lift-off process.

A thin indium layer is deposited on both the top surface of gold of the layer 102B on the carrier wafer 100 and the top surface of gold of the layer 202B on the device wafer 200. Since the indium layer uniformly wets the Au layer, the Au acts as a "substrate" for the subsequent hermetic bonding. This hermetic bonding process can essentially eliminate the air trapped in the bonding interfaces and to prevent adverse effects of the trapped air on the transferred membrane, in particular, a thin membrane with a thickness on the order of microns or less, in subsequent selective etch processes. Because indium is known to instantly oxidize in air and the oxidized indium does not provide hermetic bonding, the indium deposition process is followed by the deposition of a thin layer of gold of about 0.01 micron on the top surface of the indium layer to prevent the indium from oxidation. The deposited metal layers for bonding are patterned using a lift-off process to form the bonding indium bumps 107 and 204 as shown in FIG. 1B. This completes the wafer preparation.

Next, the carrier wafer 100 is subsequently bonded to the device wafer 200. An Electronic Vision aligner and a thermo-compression bonder may be respectively used to align and bond two patterned wafers 100 and 200 so that the surfaces with indium bumps 107 and 204 of the two wafers face each other and each indium bump 107 on the wafer 100 is aligned to a respective indium pump 204 on the wafer 204.

The bond chamber may be pumped down to a vacuum environment with a low pressure of about, e.g., $1\times10^{-5}$ Torr, before pressing the two wafers 100 and 200 against each other. A piston pressure of about 4 kPa may be applied at an elevated temperature near the melting point of indium at about 156° C. in a vacuum chamber to press the wafers 100 and 200 against each other. This process can produce a complete hermetic sealing between a pair of indium bumps 107 and 204 to form a joint indium bump 210 (FIG. 2). The hermetically-sealed bonding interface in each pair of indium bumps does not trap or absorb air. This substantially reduces the possibility of degassing from the bonding interface during the etching process which may damage the thin membrane 101 to be transferred.

Figure 3A:
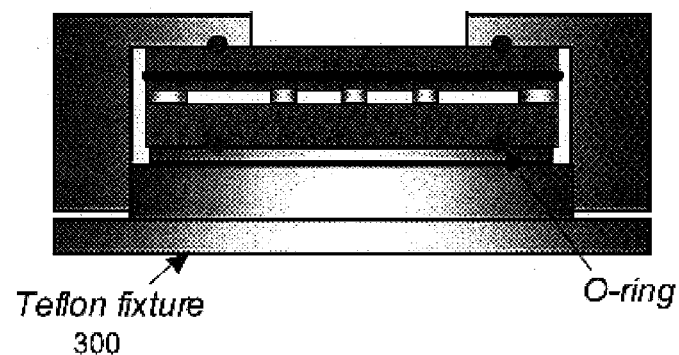
FIGS. 3A, 3B, and 3C illustrate selective etching of the bonded carrier wafer according to one embodiment.

The selective etching stage is then performed after the hermetic bonding. Initially, bonded wafers 100 and 200 shown in FIG. 2 is placed in a chemical wet etching device in a way to expose only the central portion 220 of the carrier wafer 200 to the etching chemicals and to insulate remaining portion of the wafers 100 and 200, including the peripheral region 230, bonded interfaces in the joint indium bumps 210, the device wafer 200. This isolation allows only selected portions of the wafer 200 to be etched and protects other parts. As illustrated in FIG. 3A, a Teflon fixture 300 may be used to protect the backside of the wafer pair as well as their bonded interface.

Figure 3B:
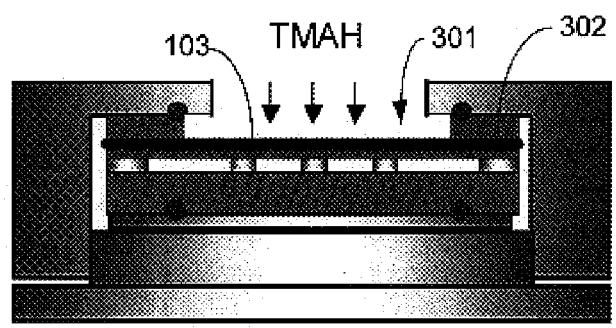
Figure 3C:
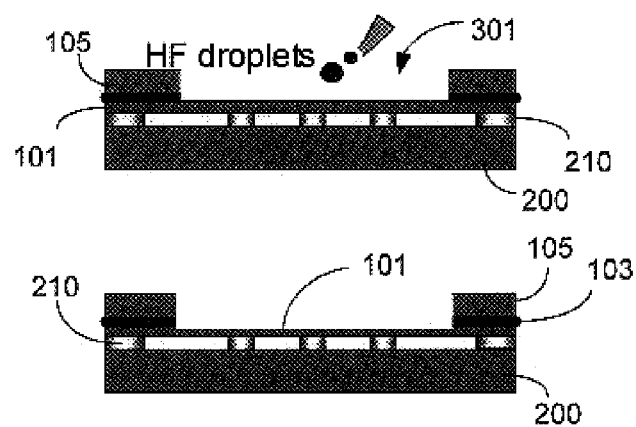

The selective etching is performed in 3 etching steps. First, the bulk of the silicon in the central region 220 of the silicon layer 105 is etched away by a wet etching process which may be performed by exposing the central region 220 of the silicon layer 105 in a 25 wt % Tetramethylammonium hydroxide (TMAH) bath at about 80° C. until the buried oxide layer 103 is exposed. Other etching chemicals such as KOH may also be used in the wet etching process. This produces a central opening 301 in the carrier wafer 100 and leaves the peripheral portion 302 unchanged due to the isolation by the Teflon fixture (FIG. 3B). Second, the exposed insulator layer 103, i.e., the oxide layer in this example, is removed by first an ashing process by using an oxygen plasma in a plasma etching chamber to remove a bulk part and then by using dilute hydrofluoric acid (49% HF) droplets to remove the residual oxide. This process exposes the membrane 101 in the opening 301 (FIG. 3C).

Figure 4A:
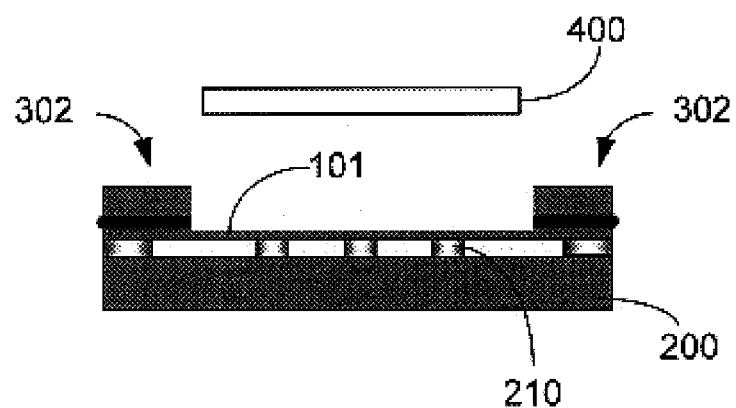
FIGS. 4A and 4B illustrate the final fabrication step to complete the transfer of the membrane to the device substrate according to one embodiment.
Figure 4B:
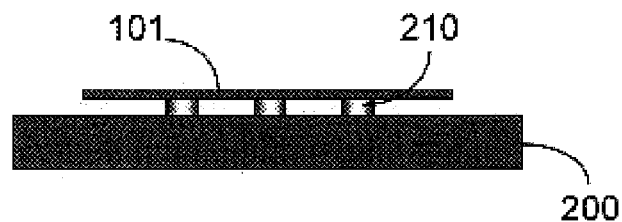

Next, the remaining peripheral region 302 of the wafer 200 is removed by a reactive ion etching process. This may be achieved by using a shadow mask 400 to block the exposed membrane 101 and applying the SF6 plasma to selectively etch the region 302 (FIG. 4A). The shadow mask 400 may also be designed to pattern the transferred membrane 101. FIG. 4B shows the final structure with the membrane 101 integrated on the device wafer 200.

Figure 5A:
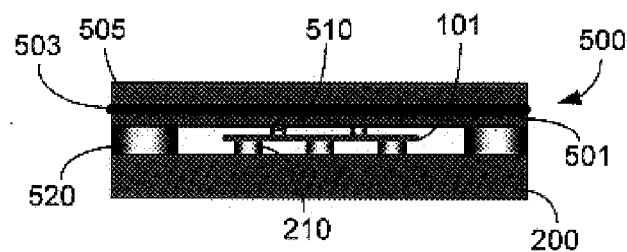
FIGS. 5A, 5B, 5C, and 5D illustrate additional fabrication steps for transferring a second membrane on a second carrier wafer onto the device wafer according to one embodiment, where the second membrane is stacked over the first transferred membrane.
Figure 5B:
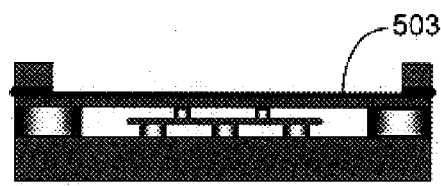
Figure 5C:
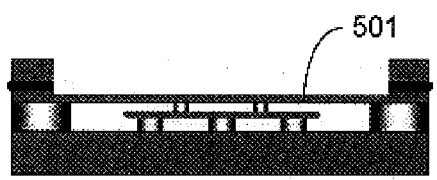
Figure 5D:
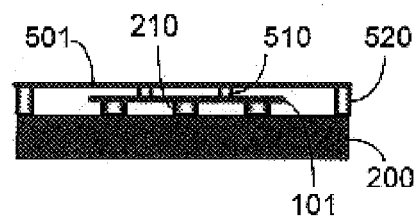

The above membrane transfer process may be repeated to transfer additional membranes to the device wafer 200 on top of the transferred membrane 101. FIGS. 5A-5D illustrates the steps of transferring a second membrane 501 from a second carrier wafer 500, which may be formed of silicon or a different material. FIG. 5A shows that the carrier wafer 500 may be similarly structured as the carrier wafer 100 with an insulator layer 503 sandwiched between the membrane 501 and a semiconductor layer 505. Indium bumps are formed on top of the membrane 101 and to be bonded to indium bumps formed on the surface of the membrane 501 of the carrier wafer 500 to form the joint indium bumps 510. In addition, larger joint indium bumps 520 are also formed between the membrane 501 and the top surface of the device wafer 200 in the peripheral region. Similar etching steps are performed to first remove the central portion of the silicon layer 505 to expose the insulator layer 503 (FIG. 5B) and the to remove the insulator layer 503 to expose the membrane 501 (FIG. 5C). Finally, the peripheral region of the wafer 500 is removed to form the final structure shown in FIG. 5D.

The above membrane transferring techniques may be applied to form a wide range of structures. The following sections describe fabrication of two exemplary deformable mirrors based on the membrane transfer.

Figure 6A:
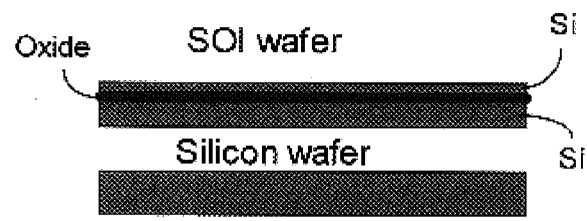
FIGS. 6A through 6L illustrate fabrication of a deformable mirror and associated electrostatic actuators based on the disclosed membrane transfer.
Figure 6B:

FIGS. 6A-6L illustrate fabrication of a deformable mirror where both the mirror and the underlying actuators are fabricated by the membrane transfer process. FIG. 6A shows a SOI carrier wafer and silicon device wafer are prepared. In FIG. 6B, a 1-micron thick corrugated polysilicon membrane is fabricated on the SOI wafer and is doped to be conductive as part of an electrostatic actuator array on the device wafer that deform the mirror. The corrugated structure is designed to control the deflection of the actuator and to release the stress caused by the bonding and deposition process and the intrinsic stress of membrane materials.

Figure 6C:
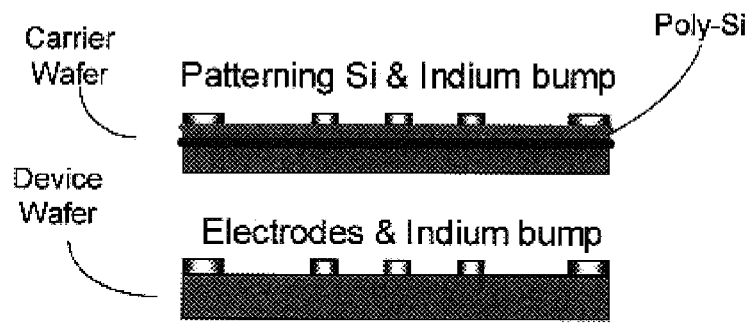
Figure 6D:
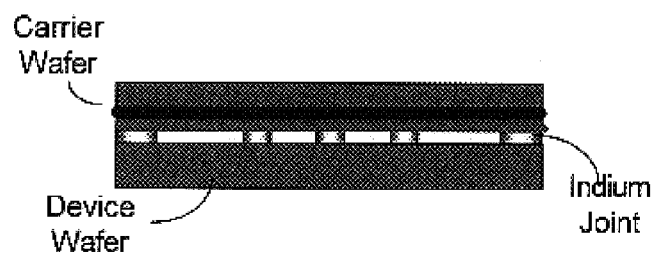

In the wafer preparation shown in FIGS. 6A through 6C, an oxide layer of about 0.5 micron thick is thermally grown on both sides of the wafers. Then Ti/Pt/Au metallization is deposited and patterned to form the electrode array on the device wafer. The carrier wafer is patterned and etched to define a 5-micron deep corrugation profile. A 1-micron thick polysilicon film is deposited on the carrier wafer after thermal oxidation to conform with the corrugation profile in the underlying silicon. This corrugated polysilicon membrane is later transferred to the device wafer. A Cr/Pt/Au metallization is deposited subsequently over the photoresist patterns on both wafers for the lift-off process. A thin indium layer is then deposited on both wafers. The indium deposition process is followed by the deposition of a gold contact layer of about 0.01 micron thick to prevent the indium from oxidation. The deposited metal layers for bonding are patterned using a lift-off process. The carrier wafer is subsequently bonded to the device wafer (FIG. 6D).

Figure 6E:
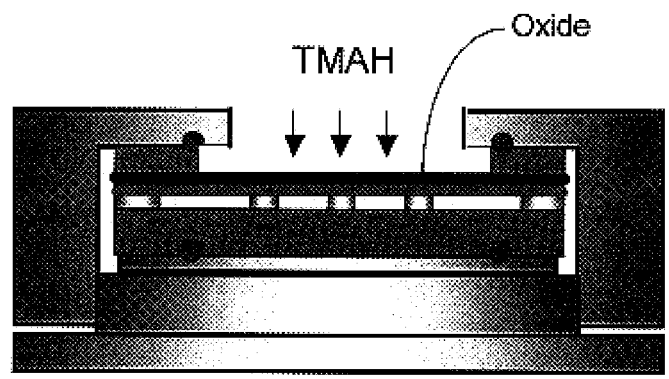
Figure 6F:
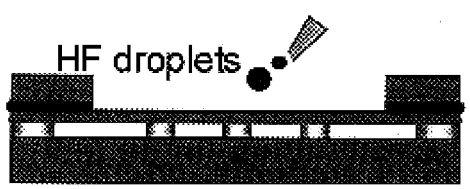
Figure 6G:
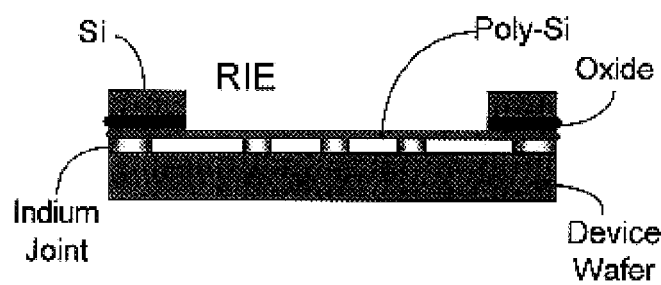
Figure 6H:
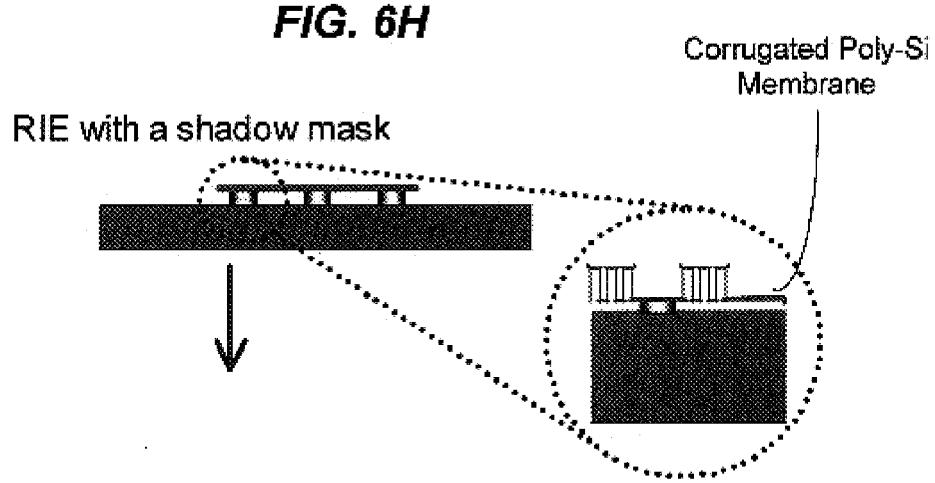
Figure 6I:
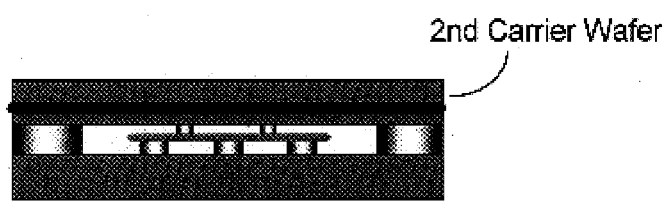
Figure 6J:
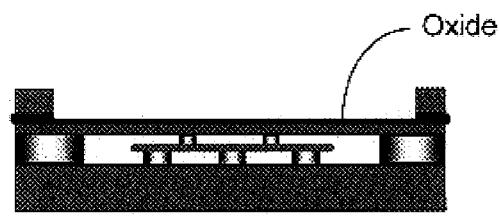
Figure 6K:
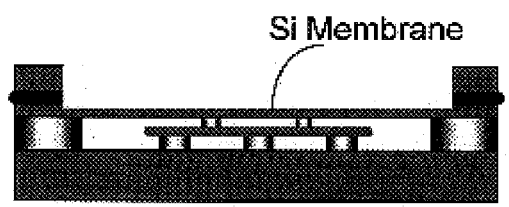
Figure 6L:
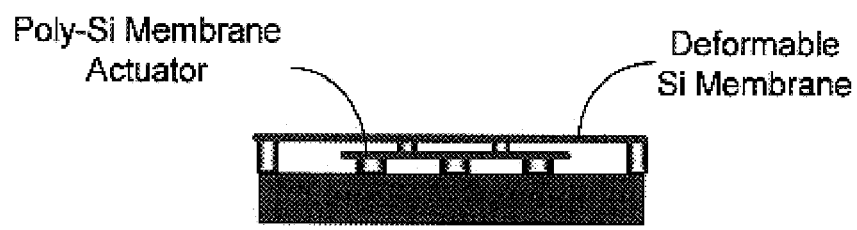
Figure 6M:
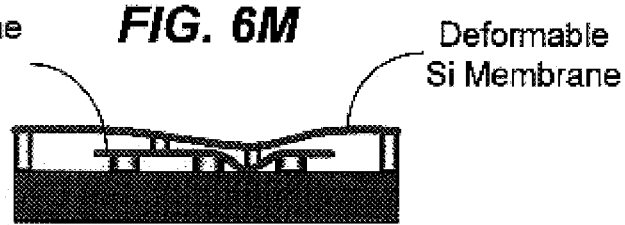
FIG. 6M shows operation of the deformable mirror shown in FIG. 6L.
Figure 7A:
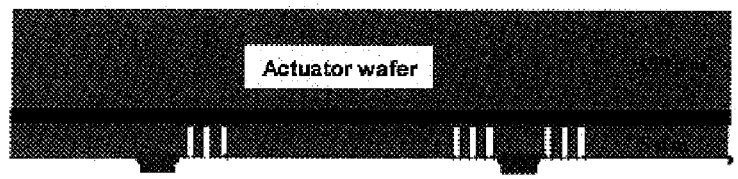
FIGS. 7A, 7B, and 7C show additional details of the deformable mirror shown in FIG. 6L.
Figure 7B:
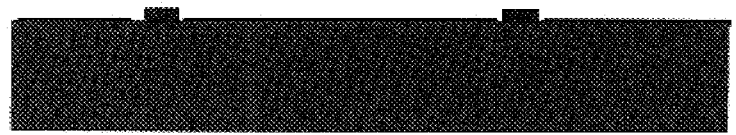
Figure 7B:
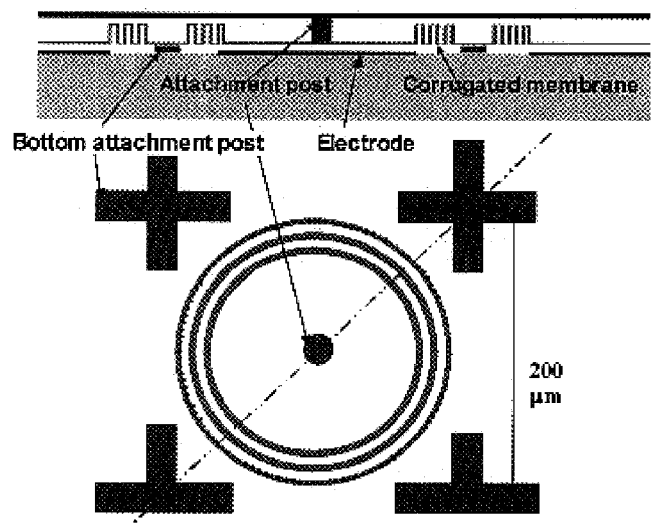
Figure 7C:
Figure 8A:
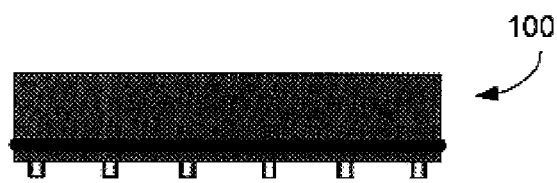
FIGS. 8A, 8B, 8C, and 8D show fabrication of a different deformable mirror by directly transferring a silicon membrane over an array of actuators on the device wafer based on the disclosed membrane transfer.
Figure 8B:
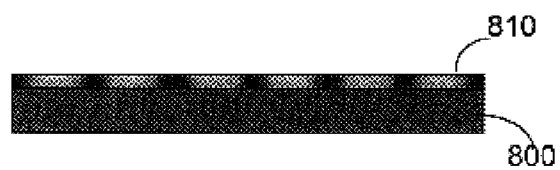
Figure 8C:
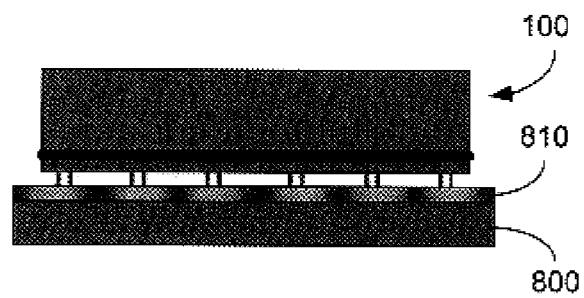
Figure 8D:
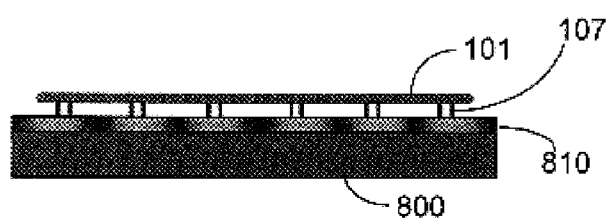

FIGS. 6E-6G illustrate the etching process. In addition to the steps shown in FIGS. 3A-3C, an oxygen plasma is used to remove possible residues on the polysilicon membrane surface after the oxide insulator layer is removed. FIG. 6H shows the structure after a SF6 plasma is used with a shadow mask to selectively etch the polysilicon membrane to pattern the transferred membrane structure. This completes the construction of the actuator array where the conductive membrane and the underlying electrodes on the top surface of the device wafer form electrostatic actuators to locally deform the membrane based on the local voltages. FIGS. 6I-6L show the subsequent transfer of a silicon membrane onto the top of the polysilicon membrane actuator to operate as the deformable mirror. FIG. 6M shows different voltages are applied to two adjacent electrodes on the device wafer to cause different local deformations. FIGS. 7A-7C show additional details of the deformable mirror device in FIG. 6L.

FIGS. 8A-8D show fabrication of another deformable mirror where a reflective silicon membrane 101 in a SOI carrier wafer is directly transferred onto an array of actuators 810 formed on a device wafer 800. The actuators 810 may be previously fabricated on the wafer 800.

In the above embodiments, individual indium bumps are used as the interfacing structures to bond the transferred membrane to the device wafer. Many other materials may also be used to replace the indium for bonding. For example, an epoxy may be used to form the bumps to bond the membrane either directly to the device wafer or to another membrane on the device wafer. This is possible in part because the bonding interface is isolated from the etching chemicals as illustrated in FIG. 3A where a Teflon fixture is used to prevent the etching solution from contacting the bonding interface. The use of an epoxy for bonding can be advantageous because the additional metal layers and processing steps associated with indium bonding can be eliminated to simplify fabrication and to increase fabrication throughput. The epoxy bonding may be particularly advantageous for bonding thick membranes with a thickness on the order of $10^2$ microns. Like the indium bonding where individual indium bumps are used to reduce the contact areas, the epoxy bonding should also be implemented by individual epoxy bumps to reduce the contact areas and hence the problems of stresses at the contacts between the epoxy and the membrane.

The above wafer-level transfer of a membrane has a number of advantages. For example, the transfer can be designed to avoid the use of adhesives or polymers (i.e. wax, epoxy, or photoresist) for bonding the membrane to the device wafer. This can eliminate residues or cracks and maintain a clean mirror membrane. Also, a continuous membrane with a usable area up to the size of the carrier wafer can be transferred in its entirety. Transfer of a 1-micron thick silicon membrane with a diameter of 100 mm has been demonstrated. This availability of a large, continuous membrane may be particularly useful in various applications including adaptive optics where discontinuities can lead to phase errors and other adverse effects.

Notably, in the present transfer process, the bonded interface is completely isolated from any acid, etchant, or solvent during the transfer to ensure a clean and flat membrane surface. The present transfer also does not require a post-assembly release process, e.g., no sacrificial layer is used for the transfer. In addition, the transferring process may be repeated to transfer two or more membranes to stack over the first transferred membrane on the same device wafer. Such a multi-membrane device may be used to complex microstructures for various applications.

The above wafer-level transfer of one or more membranes may be modified by replacing the wet etching process, e.g., using the TMAH etching liquid, with a dry gas-phase etching process to remove the carrier wafer. As described below, the present dry gas-phase transfer may simplify the transfer hardware and the processing operations for transferring membranes of selected materials. One of the distinct benefits is to reduce the stress in the transferred membrane in comparison with the above transfer process based on the wet etching.

For example, the above use of the wet etching process with a liquid etchant generally requires processing at an elevated temperature, e.g., about 80° C. for TMAH. This condition may introduce additional stress due to the different thermal expansion coefficients of different layers involved, such as the membrane 101 and the protective layer 103 on top of the membrane 101 shown in FIG. 3B. A dry gas-phase etching process, by comparison, may operate at a lower temperature such as the room temperature for certain semiconductor materials with the properly selected gaseous etchants. Hence, a proper dry gas-phase etching process may reduce the stress in the transferred membrane.

In another aspect, a liquid etchant typically used in a wet etching process generally may react in a rather mild degree with the protective layer 103. Hence, the protective layer 103 may not a "perfect" etch-stop layer and the protective layer 103 such as an oxide layer as the etch-stop layer should be sufficiently thick to effectively block the liquid etchant from reaching and thus etching the underlying membrane 101. For example, when an oxide layer is used as the layer 103 to protect a silicon membrane 101 from the TMAH, the thickness of the oxide layer 103 may be at least 0.5 micron. Due to the difference between the material properties of the oxide layer 103 and the silicon membrane 101, the oxide-silicon interface will introduce stress on the silicon membrane 101 and may cause undesired distortion in the silicon membrane 101. In addition, the oxide layer 103 has inherent stress and this stress can certainly introduce stress in the adjacent silicon membrane 101. The bonding of the carrier wafer may also introduce additional stress to the membrane 101. Therefore, to mitigate effects of these and other stresses on the membrane 101, the thickness of the membrane 101 may be limited to above a certain minimum thickness in order to maintain the distortion of the membrane under an acceptable level. Because the stress-induced distortion of the membrane 101 generally increases as the size of the membrane 101 increases, the stresses also limit the maximum size of the membrane 101 at a given thickness that can be transferred.

For at least these reasons, the wet etching in the above transfer may limit the minimum thickness and maximum size of the membrane 101 to be transferred. A proper dry gas-phase etching may be used to reduce the stresses on the transferred membrane and thus allows for transfer of membranes that are thinner and larger than what is permissible in the wet etching process. Unlike the wet etching process, As illustrated in FIGS. 3A and 3B, the wet etching process needs a fixture to isolate the joints between the membrane and the device wafer and the device wafer from the etchant chemical when etching away the carrier wafer. The present dry gas-phase etching process eliminates the need for such a fixture by simply using a passivation layer such as an oxide layer to cover otherwise exposed surfaces of the device wafer and other surfaces, in addition to as using the same material to form the protective passivation layer 103 on the membrane 101, to provide the isolation from the gaseous etchant.

Notably, in the present dry gas-phase etching process, the gaseous etchant may be properly selected for etching a semiconductor material so that a suitable material for the passivation layer may be selected to be completely or nearly completely inert to the gaseous etchant. Hence, this suitable material is a "perfect" etch-stop material to a certain extent and a very thin layer of this material, much less than 0.5 micron (e.g., on the order of 100 angstroms) may be formed over the membrane as the protective passivation layer to reduce the stresses contributed by the presence of the passivation layer.

In one implementation where the carrier wafer is a silicon wafer, the gaseous etchant may be the gas of $XeF_2$ to etch silicon. Silicon oxide may be used as the passivation layer 103 on the membrane 101 to stop the etching by $XeF_2$ because silicon oxide is practically completely inert to $XeF_2$. Hence, for the echant gas $XeF_2$, a very thin layer of silicon oxide, e.g., on the order of 100 angstroms may be used as the passivation layer and may be coated in other exposed surfaces of the device wafer to prevent etching by $XeF_2$. As described below, this use of silicon oxide layer to cover other surfaces of the device wafer provides the desired isolation and avoids the need to use an external fixture shown in FIGS. 3A and 3B for isolating the joints for membrane and the device wafer from the etchant.

The gas etchant $XeF_2$ etches silicon by slowly reacts with silicon at a low temperature, e.g., at the room temperature and perfectly stops at the oxide layer practically without etching any silicon oxide. In addition to allowing for a thin layer of silicon oxide with a thickness of about 100 angstroms as an effective etch-stop layer to reduce stresses in the membrane, the low operating temperature for the gas-phase etching helps to further reduce the stresses in the membrane. Moreover, direct Si—Si bonding may be used to bond the silicon membrane to the silicon device wafer to substantially eliminate the stresses at the bonding interfaces between the transferred membrane and the device wafer.

In one implementation of the transfer based on the dry gas-phase etching process, a carrier wafer is prepared to have a support wafer made of a semiconductor material, a carrier passivation layer formed on a surface of the support wafer, and a membrane made of the semiconductor material formed on the carrier passivation layer. The carrier passivation layer is inert to a gaseous etchant that etches the semiconductor material. A surface of a device wafer made from the semiconductor material is patterned to form two or more posts each of which has a top flat surface. Next, a passivation layer is formed on exterior surfaces of the device wafer without covering each top flat surface of each post. This completes the wafer preparation for the transfer.

To transfer the membrane, the carrier wafer is first placed on the device wafer to have the membrane directly contact top flat surfaces of the posts. Next, a direct semiconductor-to-semiconductor bonding is formed between the membrane and the top flat surfaces to bond the carrier wafer to the device wafer. The bonded carrier wafer and the device wafer are then exposed to the gaseous etchant to etch away the support wafer in the carrier wafer and to expose the carrier passivation layer. Finally, the carrier passivation layer on top of the membrane is removed, e.g., by using an etching process, to complete the transfer of the membrane to the device wafer.

In the above implementation, it may be desirable to form a through hole through the device wafer to connect the surface of the device wafer and an opposing surface of the device wafer so that the space between the transferred membrane and the device wafer between the semiconductor posts are not sealed in vacuum. This may be done either during the preparation of the device wafer or after the carrier wafer is bonded to the device wafer by the direct semiconductor-to-semiconductor bonding between the membrane and the posts. Next, a back wafer may be bonded to the opposing surface of the device wafer to cover the through hole. The back wafer may be patterned to have a sealing pattern around the through hole to seal the through hole. After the removal of the carrier passivation layer during the transfer, the back wafer may then be patterned to expose the through hole through the back wafer.

Figure 9A:
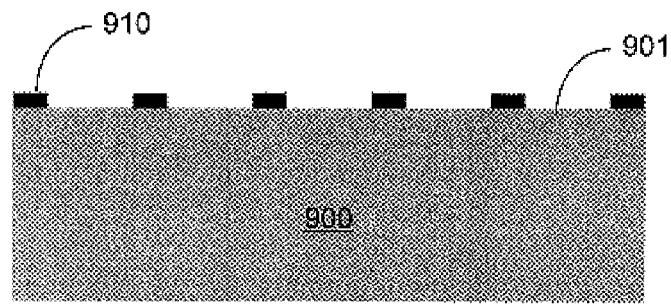
FIGS. 9A, 9B, 9C, 9D, 9E, 9F, 9G, and 9H illustrate one exemplary processing flow for transferring a silicon membrane based on direct Si—Si bonding and a dry gas-phase etching using $XeF_2$.
Figure 9B:
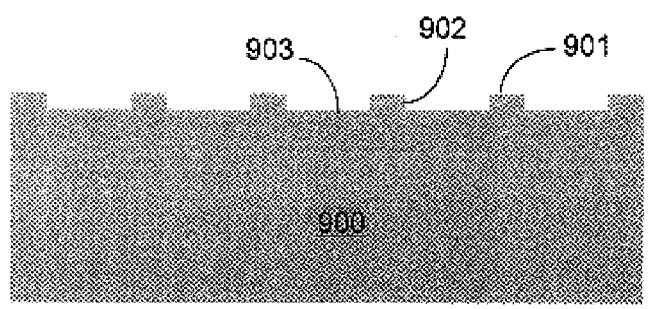
Figure 9C:
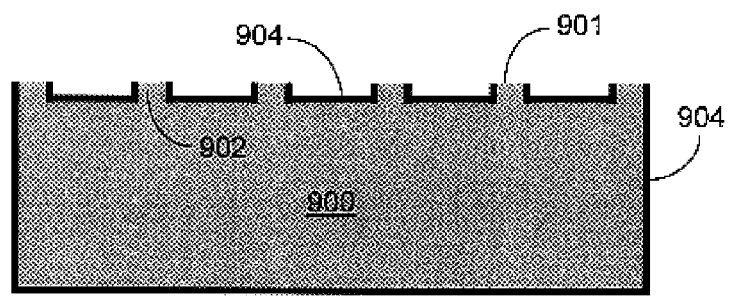

One example of the semiconductor material is silicon. FIGS. 9A and 9B illustrate preparation of an exemplary silicon device wafer based on the above implementation. In FIG. 9A, multiple silicon nitride islands 910 are formed on the flat and bare surface 901 of the silicon device wafer 900. The exposed areas of the bare surface 901 of the silicon device wafer 900 are then etched below the initial surface 901 to a surface 903 and to form silicon posts 902 under the areas covered by the silicon nitride. This etching process may be carried out by using a wet etching method with an echant such as KOH. FIG. 9B shows the result of this processing step. Next, a silicon oxide layer 904 is deposited on the exterior surface of the silicon device wafer 900 except the top flat surfaces 901 of the silicon posts as illustrated in FIG. 9C. At this point, the silicon device wafer is ready for the transfer.

Figure 9D:
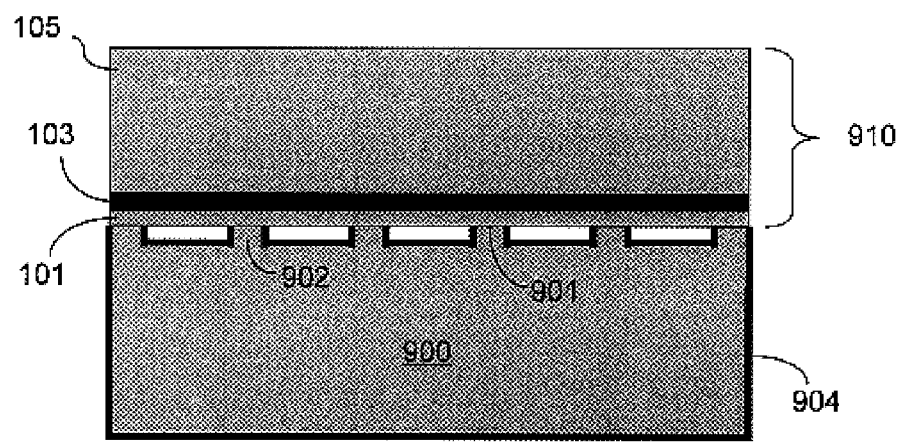

FIG. 9D shows, among other features, a carrier wafer 910 that is ready for the transfer as an example. The carrier wafer 910 includes a silicon support wafer 105, a carrier passivation layer 103 made of silicon oxide on the silicon support wafer 105, and a silicon membrane 101 to be transferred to the device wafer 900. The exposed surface of the silicon membrane 101 is bare and has no other layers for the subsequent direct Si—Si bonding. FIG. 9D further shows the first step of the actual transfer, where the carrier wafer 910 is placed on the device wafer 900 so that the silicon membrane 101 rests on and is in direct contact with the top flat surfaces 901 of the silicon posts 902. At this position, the carrier wafer 910 and the device wafer 900 are pressed against each other under a high pressure and at an elevated temperature to cause the direct Si—Si bonding at each interface between the membrane 101 and the surfaces 901 on top of the silicon posts 902. The side surfaces of the silicon membrane 101 may be optionally covered by a layer of silicon dioxide.

Next, the silicon support wafer 105 is exposed to the $XeF_2$ gas at about the room temperature to begin the dry gas-phase etching. The $XeF_2$ gas reacts with the exposed silicon of the wafer 105 and gradually etches it off. The silicon oxide passivation layer 904 protects other silicon parts from the $XeF_2$ gas. After the wafer 105 is removed, the carrier passivation layer 103 (silicon oxide) is also removed, e.g., by etching with HF. As a result, the silicon membrane 101 is now directly bonded to the silicon posts 902 as an integrated part of the device wafer. This completes the transfer.

Figure 9E:
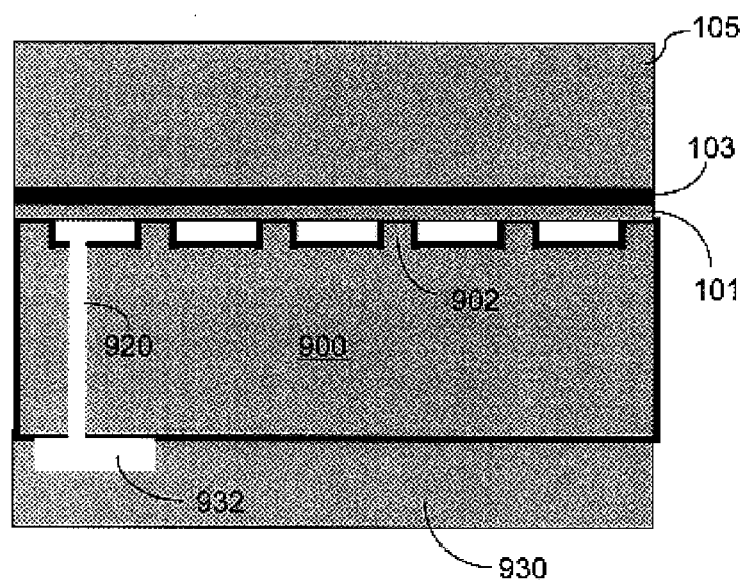

FIGS. 9E, 9F, 9G, and 9H illustrate the above transfer steps and an optional process for making a through hole 920 in the silicon device wafer 900. FIG. 9E shows that the through hole 920 is fabricated so the space between the transferred silicon membrane 101 is not sealed off. A silicon back wafer 930 may be bonded to the back surface of the wafer 900 to seal the through hole 920 during the transfer process. The back wafer 930 may be patterned to have a sealing pattern 932 around the opening of the through hole 920 to seal the hole 920. Alternatively, this may be done during the preparation of the device wafer. Prior to the gas-phase etching by using the $XeF_2$ gas, a layer of silicon oxide may be coated on the exterior surfaces of the back wafer 930.

Figure 9F:
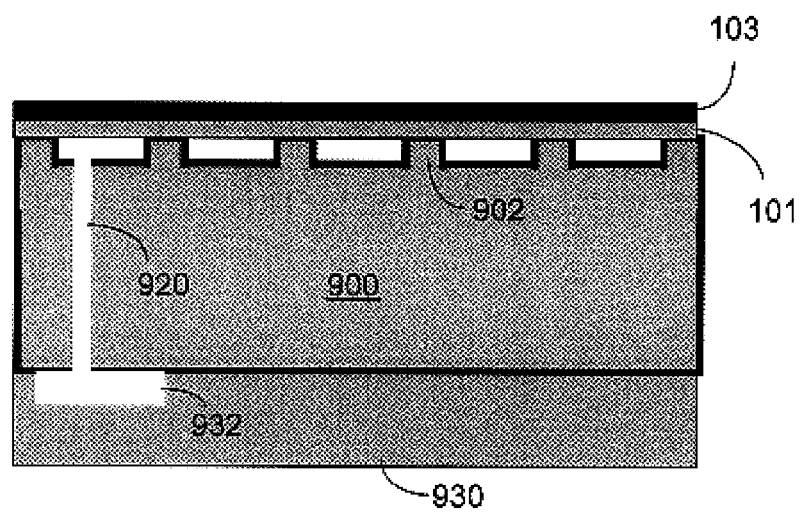
Figure 9G:
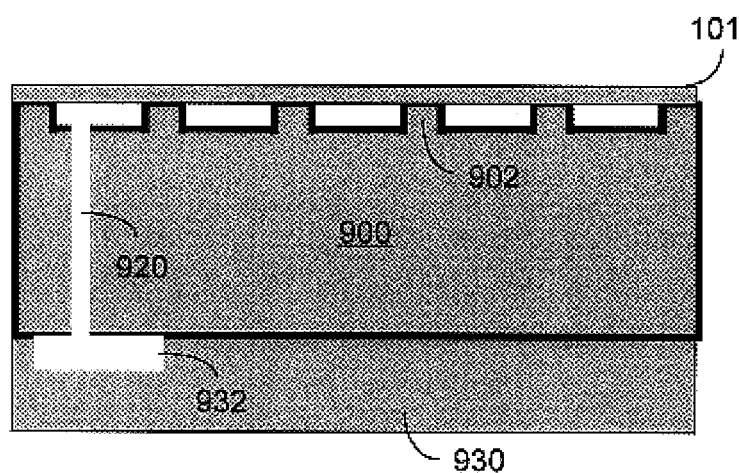
Figure 9H:
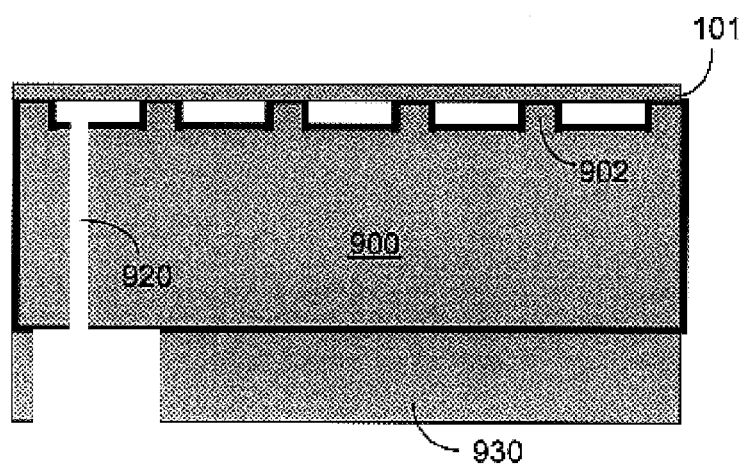

FIGS. 9F and 9G show the etching of the wafer 105 by using the $XeF_2$ gas and the removal of the carrier passivation layer 103, respectively. The passivation layer 103 may be removed by using a proper etching process. For example, if the layer 103 is silicon dioxide, a wet etching process with HF or buffered oxide etchant (e.g., a HF-based liquid) may be used to etch away the silicon dioxide. FIG. 9H shows that the back wafer 930 is patterned by selective etching to expose the hole 920 through the back wafer 930.

The present transfer based on the dry gas-phase etching process may also be implemented to by using metal joints to hold the transferred membrane to the receiving device wafer. In this implementation, a carrier wafer is prepared to have a support wafer made of a semiconductor material, a carrier passivation layer formed on a surface of the support wafer, a membrane made of the semiconductor material formed on the carrier passivation layer, and metal posts on the membrane. The geometry of this carrier wafer may be similar to the carrier wafer shown in FIG. 1B. The carrier passivation layer is inert to a gaseous etchant that etches the semiconductor material. A surface of a device wafer made from the semiconductor material is patterned to form metal posts that respectively correspond to the metal posts on the membrane. This completes the wafer preparation for the transfer.

Next, the carrier wafer is placed on the device wafer to have metal posts on the membrane directly contact metal posts on the device wafer, respectively. Direct metal-tometal bonding is then formed between contacting metal posts to bond the carrier wafer to the device wafer. A passivation layer such as a silicon dioxide layer is also formed on exterior surfaces of the device wafer while leaving the support wafer exposed.

At this point, the bonded carrier wafer and the device wafer are exposed to the gaseous etchant to etch away the support wafer in the carrier wafer and to expose the carrier passivation layer. Finally, the carrier passivation layer is removed to transfer the membrane to the device wafer.

Figure 10A:
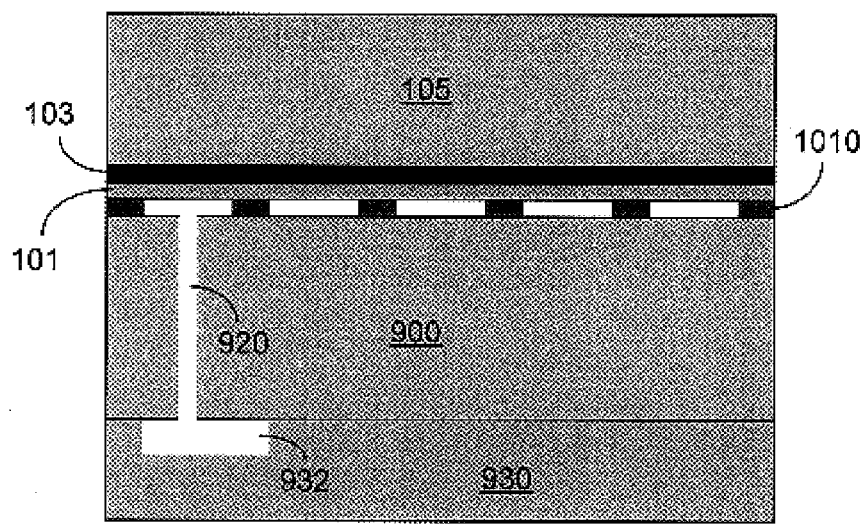
FIGS. 10A, 10B, and 10C illustrate one exemplary processing flow for transferring a silicon membrane using metal joints to hold the transferred membrane to the receiving device wafer and a dry gas-phase etching using $XeF_2$.
Figure 10B:
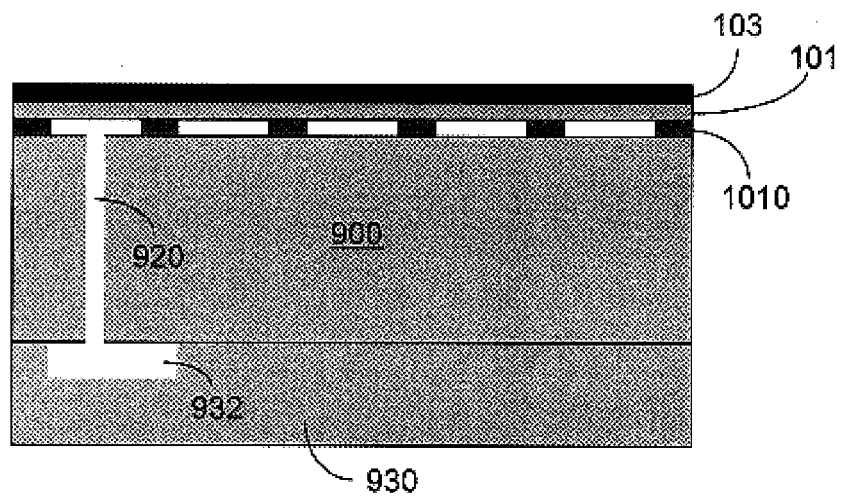
Figure 10C:
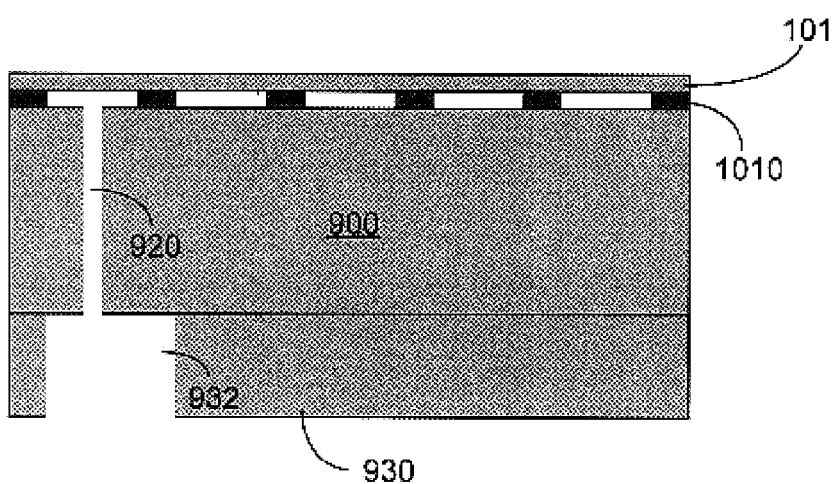

FIGS. 10A, 10B, and 10C illustrate one example of this transfer process for silicon based devices. FIG. 10A shows the structures of the device and carrier wafers after the metal-metal bonding to form the metal joints 1010 between the silicon membrane 101 and the silicon device wafer 900. The metal joints may be indium joints. Indium is a compliant metal and hence may be used to reduce the stresses on the membrane 101. Other compliant metals may also be used. FIGS. 10B and 10C show remaining processing steps and the optional process of making the through hole 920 in the device wafer 900 with assistance from a back wafer 930.

Figure 11A:
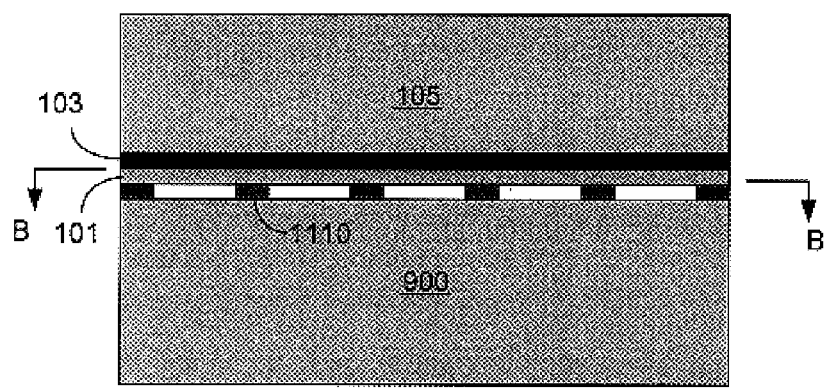
FIGS. 11A, 11B, and 11C show another dry etching process for transferring a membrane without hermetic seal.
Figure 11B:
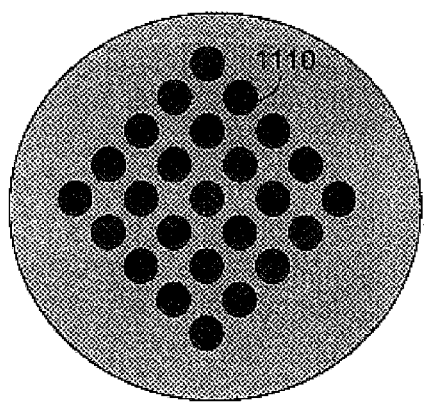
Figure 11C:
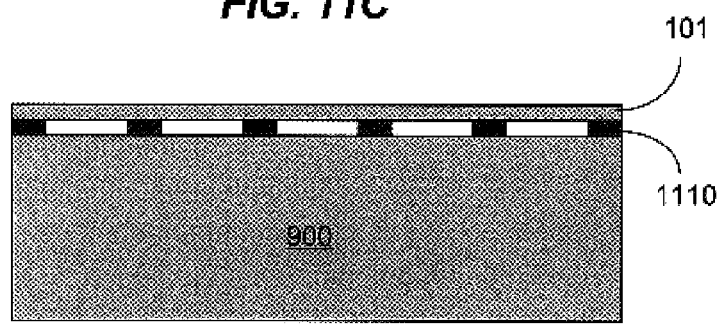

FIGS. 11A, 11B, and 11C show another transfer process based on XeF2 dry etching where the bonded surface is not hermetically sealed. The posts 1110 that support the membrane 101 may be a metal such as gold or a solder material, or silicon. FIG. 11A shows that except the top surface of the carrier wafer 105, all other exposed surfaces are covered with non-silicon protection layer, such as silicon oxide. FIG. 11B shows a cross sectional view along the line BB in FIG. 11A. The dry etching with XeF2 is then performed to remove the carrier wafer 105. Next shown in FIG. 11C, the protection layer silicon oxide is etched away to complete the transfer.

The direct Si—Si bonding shown in FIGS. 9A through 9D may also be used in the wet etching process show in FIGS. 3A-3C, 4A, and 4B. In this process, a Teflon fixture may be used to isolate the Si—Si interface and the device wafer from the etching chemical such as TMAH and others.

The membrane to be transferred in the above examples may use the same material as the carrier wafer and the device wafer such as silicon. The membrane may also be made of a material other than silicon. In general, this membrane may be a material different from either of the carrier wafer and the device wafer. For example, in addition to semiconductor materials, the membrane to be transferred may be metals or polymers. The carrier and device wafers may be made of the same material such as silicon in some of the described examples. Alternatively, the carrier and device wafers may be made of different materials.

Only a few examples and implementations are disclosed. However, it is understood that variations and enhancements may be made. All these examples, implementations, and other variations are intended to be encompassed by the following claims.

What is claimed is:

1. A method, comprising:
   preparing a carrier wafer to have a support wafer made of a semiconductor material, a carrier passivation layer formed on a surface of the support wafer, and a membrane formed on the carrier passivation layer, wherein the carrier passivation layer is inert to a gaseous etchant that etches the semiconductor material;
   patterning a surface of a device wafer made from the semiconductor material to form a plurality of posts, each post having a top flat surface;
   forming a passivation layer on exterior surfaces of the device wafer without covering each top flat surface of each post;
   placing the carrier wafer on the device wafer to have the membrane directly contact top flat surfaces of the posts;
   forming a direct semiconductor-to-semiconductor bonding between the membrane and the top flat surfaces to bond the carrier wafer to the device wafer;
   exposing the bonded carrier wafer and the device wafer to the gaseous etchant to etch away the support wafer in the carrier wafer and to expose the carrier passivation layer; and
   removing the carrier passivation layer to transfer the membrane to the device wafer.

2. The method as in claim 1, wherein the support wafer is made of silicon and the gaseous etchant is XeF2.

3. The method as in claim 2, wherein the carrier passivation layer in the carrier wafer and the passivation layer on the device wafer are silicon oxide.

4. The method as in claim 2, wherein the carrier passivation layer is about 100 angstroms.

5. The method as in claim 2, wherein the membrane is less than one micron in thickness.

6. The method as in claim 2, wherein the membrane is silicon.

7. The method as in claim 2, wherein the membrane is made of a material other than silicon.

8. The method as in claim 1, further comprising:
   forming a through hole through the device wafer to connect the surface of the device wafer and an opposing surface of the device wafer; and
   bonding a back wafer to the opposing surface of the device wafer to cover the through hole.

9. The method as in claim 8, further comprising patterning the back wafer to have a sealing pattern around the through hole to seal the through hole.

10. The method as in claim 9, further comprising:
    after the removal of the carrier passivation layer, patterning the back wafer to expose the through hole through the back wafer.

11. A method, comprising:
    preparing a carrier wafer to have a support wafer made of silicon, a carrier passivation layer formed on a surface of the support wafer, a membrane formed on the carrier passivation layer, and a plurality of posts on the membrane, wherein the carrier passivation layer is inert to a gaseous etchant that etches silicon;
    placing the carrier wafer on a device wafer to bond the posts to the device wafer;
    forming a passivation layer on exterior surfaces of the device wafer while leaving the support wafer exposed;
    exposing the bonded carrier wafer and the device wafer to the gaseous etchant to etch away the support wafer in the carrier wafer and to expose the carrier passivation layer; and
    removing the carrier passivation layer to transfer the membrane to the device wafer.

12. The method as in claim 11, wherein the posts are metals.

13. The methods as in claim 11, wherein the posts are silicon.

14. The method as in claim 11, wherein the membrane is a metal.

15. The method as in claim 11, wherein the membrane is a polymer.

16. The method as in claim 11, wherein the membrane is a material different from silicon.

* * * * *